HIDDEN EMITTER SWITCHING DEVICE

Filed Aug. 19, 1965

INVENTOR.
JACQUES R. BEAUDOUIN

BY

Fleht and Swain
ATTORNEYS 3,346,785
Patented Oct. 10, 1967

3,346,785

HIDDEN EMITTER SWITCHING DEVICE

Jacques R. Beaudouin, San Mateo, Calif., assignor to International Telephone and Telegraph Corporation, Nutley, N.J., a corporation of Maryland Filed Aug. 19, 1965, Ser. No. 480,953
3 Claims. (Cl. 317—234)

ABSTRACT OF THE DISCLOSURE

A four-layer semiconductor switching device having both contacts on one surface thereof. A conductive layer on the opposite surface short-circuits the corresponding emitter junction, which is formed by a plurality of end zone regions inset into the next adjacent zone and contiguous with said adjacent zone at said opposite surface.

This invention relates generally to a semiconductor switching device and more particularly to a semiconductor switching device employing a hidden emitter.

Triggering or switching devices of the multiple layer type are well known in the art. One such device is the so-called four layer diode which includes four successive regions or zones forming three rectifying junctions. A device of this type triggers from a low conducting (high resistance) to a high conducting (low resistance) state in response to a voltage of predetermined amplitude. The voltage across the device is applied with a polarity which serves to bias the end junctions in the forward direction and to reversely bias the center junction.

The device may be viewed as a pair of complementary transistors with the center junction acting as the collector junction of each. As the voltage is increased, avalanche sets in at the center (collector) junction and the current increases rapidly. If means are provided whereby the complementary transistors have low alphas for low current densities and high alphas for high current densities, then when avalanche sets in, the sum of the alphas for the two transistors will be greater than one and the device will make a rapid transition to the high conductance condition. The voltage required to sustain conduction will be considerably less than the voltage required to trigger the device.

Devices of the type described above have been formed by rate growing, diffusion and epitaxial techniques. Generally, the four successive zones have been either in the form of three regions inset into a wafer, or four successive layers. The two terminals have been disposed on opposite sides of the wafer where the structure is layered. In those instances where the regions are inset from one face, both terminals have been applied to the same face. In either type of device, a number of processing steps are involved in forming the same. The devices are relatively expensive.

It is a general object of the present invention to provide a switching device of the foregoing character which is easy to fabricate.

It is another object of the present invention to provide a four-layer switching device having oxide passivated junctions.

It is still another object of the present invention to provide a hidden emitter switching device suitable for use in integrated circuit technology.

It is still another object of the present invention to provide a four-layer device which can be fabricated with a wide range of switching voltages.

These and other objects of the invention will become more clearly apparent from the following description taken in conjunction with the accompanying drawing.

Referring to the drawing.

As will become more clear from the following description, the device of the present invention is, in effect, an integrated circuit consisting of an NPN transistor, a PNP transistor and a PN diode. The forward breakdown voltage is determined by the blocking junction of one of the transistors. The PNP transistor has a shorted hidden emitter. The series PN diode determines part of the reverse voltage.

Generally, the hidden emitter is a grid-like structure shorted to the N-type base by a metal layer. This structure, as will be seen hereinafter, provides the necessary diffusion of minority carriers to reach the alpha values needed for switching.

Figure 1:
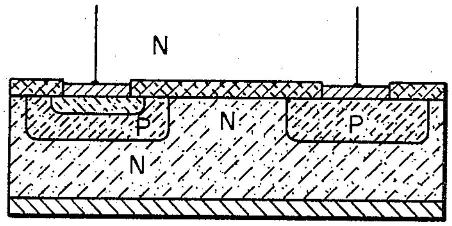
PRIOR ART FIG. 1
FIGURE 1 is a sectional view showing a prior art switching device.
Figure 2:
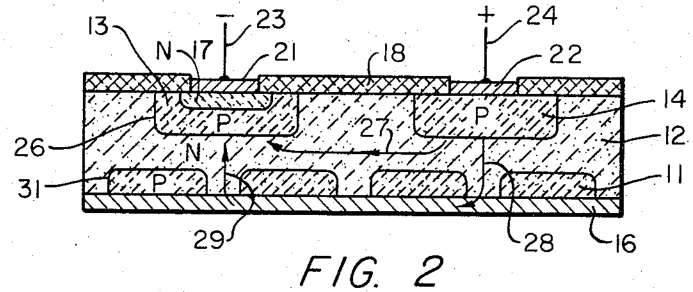
FIGURE 2 is a sectional view of a switching device in accordance with the present invention.
Figure 3:
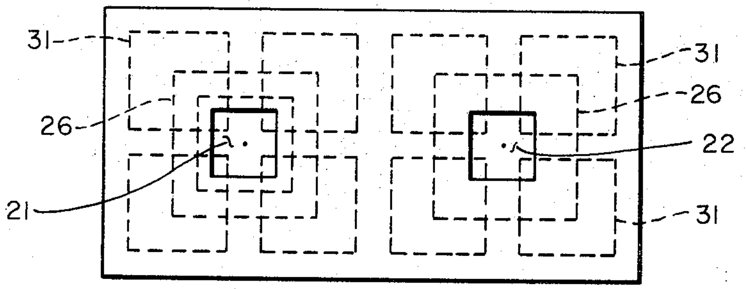
FIGURE 3 is a plan view of the device shown in FIGURE 2.

FIGURE 1 shows a planar four-layer switching device in accordance with the prior art. It is seen that one of the two transistors will have a relatively low alpha because of the geometrical arrangement, surface recombination of minority carriers and impurity concentration of the zones. In the illustrated device, it is the PNP transistor which has the low alpha. The emitter efficiency of the PNP transistor is too low because of the path length through the base zone or region surface recombination and the impurity concentrations of the regions.

In accordance with the present invention, there is provided, in addition to regions inset from one surface, regions which are inset from the other surface and which may be formed during the diffusion of the upper inset regions. The device illustrated includes a P-type grid 11 diffused inwardly into the N-type wafer 12 from the lower surface. The grid can be diffused at the same time as the inset P-type regions 13 and 14 on the other face. The grid is shorted to the N-type base 12 by the conductive layer 16. An N-type emitter region 17 is diffused into one of the P-type inset regions. Windows are formed in the oxide layer 18 to expose the underlying regions 14 and 17. Ohmic connections 21 and 22 are formed with the exposed portions of the regions 14 and 17 as, for example, by evaporation or plating through the windows. Leads 23 and 24 may be connected to the ohmic connections. It is observed that the junctions are oxide passivated.

Operation of the switching device of the present invention will be more clearly understood from the following. When a voltage is applied with the polarity indicated, the PN diode (14, 12) is forward biased and carriers are injected into the base region 12. These carriers diffuse under the influence of the applied voltage towards the collector junction 26. However, there is also a voltage between the emitting junction and the metal base. Some carriers flow toward the metal base. They can flow laterally along the metal base to a region opposite the collector junction 26 where they flow upwardly toward the junction. The proportion of current in the two paths is dependent upon the resistance of the two paths. The two current paths are illustrated schematically by the arrows 27 and 28, respectively. The current flowing from the metal layer towards the junction 26 gives rise to a voltage drop in the region 29. This voltage drop forward biases the hidden emitter junction 31. The hidden emitter injects carriers into the base region 12 at a point opposite the collector junction 26. This increase in current increases the alpha so that the device switches. The diode provides the current which contributes to the switching of the NPN and PNP transistors.

When a voltage of opposite polarity is applied, the PN diode (14, 12) is reverse biased. The diode determines the high reverse breakdown voltage of the device.

A device in accordance with the foregoing can be easily constructed. The first step in the fabrication is to provide an oxide layer on the surface of a starting wafer of N-type material. Windows or openings are then formed at selected areas of the oxide coating in the oxide layer, by well known photoresist and etching techniques, to expose the underlying wafer. P-type impurities are predeposited through the windows. A high temperature diffusion defines the inset P-type regions 11, 13 and 14. During the diffusion, an oxide layer will be formed at the windows. A subsequent masking and etching operation will serve to open a window for the formation of the emitter region 17. N-type material is predeposited at the window and diffused into the wafer to form the inset emitter region 17. Oxide is then selectively removed from the upper surface to form windows which expose portions of the underlying regions and the oxide is removed from the entire lower surface. A conductive layer is then formed on the exposed portions of the wafer. The lower conductive layer 16 shorts the emitter regions 11 to the base region 12. The conductive layers 21 and 22 provide the ohmic connections to the inset regions 14 and 17. Thus, it is seen that the diffusion schedule is relatively simple since several of the regions can be formed in one step. The device which is formed has oxide passivated junctions. The connections are from one surface. The device is well suited for integrated circuit technology.

Figure 4:
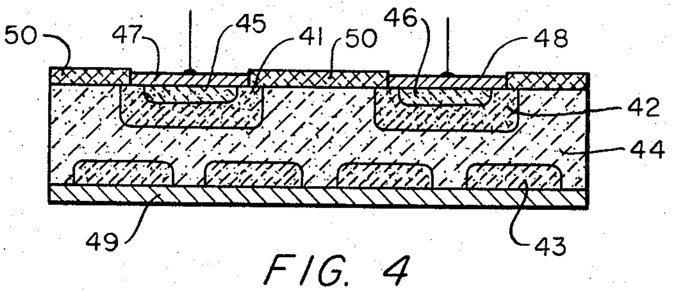
FIGURE 4 is a sectional view of another switching device.

As is well known, so-called five-layer switching devices have switching characteristics that are symmetrical. A five-layer switching device may be constructed with a hidden shorted emitter as described above. A five-layer device is shown in FIGURE 4. The device includes P-type regions 41, 42 and 43 inset into an N-type wafer 44, and N-type regions 45 and 46 inset into the P-type regions 41 and 42. Oxide layer 50 passivates the junctions formed between the regions 41 and 42 and the wafer. Ohmic connections 47 and 48 are formed with regions 41, 42, 45 and 46. These short the emitter-base junctions of the respective devices. A conductive layer 49 shorts the emitter 43.

In one polarity, the complementary pair of transistors comprises the NPN and PNP transistors on the left-hand side; while in the other direction of operation, the switching device comprises the NPN and PNP transistors on the right-hand side. The action of the hidden emitter is as described above.

Although the foregoing description has reference to one particular arrangement of conductivity types, it is apparent that the invention can be practiced by changing the conductivity types so that the NPN devices or transistors are changed to PNP and the diodes are changed from PN to NP, as the case may be.

Thus, it is seen that there is provided a switching device which is of the planar oxide passivated type which is simple and economical in construction.

I claim:

1. A semiconductor switching device, comprising:

a wafer of semiconductor material of one conductivity type having upper and lower opposed major surfaces, said wafer having four zones of alternately different conductivity types successfully interposed between said surfaces, one end zone comprising a plurality of regions contiguous with said lower surface, said end zone being inset into the next adjacent zone such that said lower surface is common to both said end and adjacent zones, said next adjacent zone extending to said upper surface;

a conductive layer on said lower surface electrically interconnecting said end and adjacent zones, said layer being free of any external electrical connections thereto;

a first electrode on said upper surface in ohmic contact with the other end zone;

a second electrode spaced from said first electrode on said upper surface; and means electrically coupling said second electrode to said next adjacent zone, the thickness, resistivities, and minority carrier lifetimes of said zones being such that application of an increasing voltage between said electrodes of reverse polarity to the central junction between the two of said four zones adjacent the end zones switches said device from a high resistance to a low resistance state when said increasing voltage exceeds the reverse breakdown voltage of said central junction and the junction between said one end zone and said next adjacent zone is internally biased to cause conduction through all four zones by the internal voltage drop due to the initial current flow across said central junction.

2. A device according to claim 1, wherein said means includes an auxiliary zone of conductivity type opposite to said next adjacent zone inset into said wafer from said upper surface to form a rectifying junction with said next adjacent zone.

3. A device according to claim 2, further comprising a first additional zone of one conductivity type inset into said auxiliary zone from said upper surface and forming a PN junction with said auxiliary zone, said second electrode being in ohmic contact with said first additional zone.

References Cited

UNITED STATES PATENTS

| | | | |
|---|---|---|---|
| 2,971,139 | 2/1961 | Noyce | 317—235 |
| 3,217,212 | 11/1965 | Ryder | 317—235 |
| 3,243,669 | 3/1966 | Sah | 317—235 |
| 3,265,909 | 8/1966 | Gentry | 317—235 |
| 3,274,463 | 9/1966 | Hutson | 317—235 |

OTHER REFERENCES

Electronics: Helpful Transistor Analogy 4-Layer PNPN=2 Transistors by Stasier, August 10, 1964, pp. 66–68.

JOHN W. HUCKERT, *Primary Examiner.*

JAMES KALLAM, *Examiner.*

J. D. CRAIG, *Assistant Examiner.*